(12) United States Patent
Niu et al.

(10) Patent No.: US 8,729,702 B1
(45) Date of Patent: May 20, 2014

(54) COPPER SEED LAYER FOR AN INTERCONNECT STRUCTURE HAVING A DOPING CONCENTRATION LEVEL GRADIENT

(71) Applicants: STMicroelectronics, Inc., Coppell, TX (US); International Business Machines Corporation, Armonk, NY (US)

(72) Inventors: Chengyu Niu, Fishkill, NY (US); Andrew Simon, Fishkill, NY (US); Keith Kwong Hon Wong, Wappingers Falls, NY (US); Yun-Yu Wang, Poughquag, NY (US)

(73) Assignees: STMicroelectronics, Inc., Coppell, TX (US); International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/682,162

(22) Filed: Nov. 20, 2012

(51) Int. Cl.
*H01L 23/40* (2006.01)
*H01L 21/82* (2006.01)
*C23C 14/00* (2006.01)

(52) U.S. Cl.
USPC ............ 257/751; 257/E23.155; 257/E23.161; 438/128; 204/298.13

(58) Field of Classification Search
CPC . H01L 21/2257; H01L 21/2255; H01L 29/36; C23C 14/2414; C23C 14/3407; C23C 14/35
USPC ......... 257/191, 655, 751, E23.155, E23.161; 438/561, 627, 678
See application file for complete search history.

(56) References Cited

U.S. PATENT DOCUMENTS

| | | | |
|---|---|---|---|
| 6,740,585 B2 * | 5/2004 | Yoon et al. | 438/680 |
| 6,800,554 B2 * | 10/2004 | Marieb et al. | 438/687 |
| 7,199,052 B2 | 4/2007 | Cohen | |
| 7,396,755 B2 | 7/2008 | Haider | |
| 7,704,886 B2 | 4/2010 | Su et al. | |
| 8,252,690 B2 | 8/2012 | Su et al. | |
| 2001/0041250 A1 * | 11/2001 | Werkhoven et al. | 428/212 |
| 2002/0028576 A1 * | 3/2002 | Hashim et al. | 438/653 |
| 2008/0190760 A1 | 8/2008 | Tang et al. | |
| 2009/0321935 A1 * | 12/2009 | O'Brien et al. | 257/751 |
| 2009/0321938 A1 | 12/2009 | Cunningham | |
| 2010/0230818 A1 | 9/2010 | Birner et al. | |

\* cited by examiner

*Primary Examiner* — Nikolay Yushin
(74) *Attorney, Agent, or Firm* — Gardere Wynne Sewell LLP

(57) ABSTRACT

A trench is opened in a dielectric layer. The trench is then lined with a barrier layer and a metal seed layer. The metal seed layer is non-uniformly doped and exhibits a vertical doping gradient varying as a function of trench depth. The lined trench is then filled with a metal fill material. A dielectric cap layer is then deposited over the metal filled trench. Dopant from the non-uniformly doped metal seed layer is then migrated to an interface between the metal filled trench and the dielectric cap layer to form a self-aligned metal cap.

26 Claims, 9 Drawing Sheets

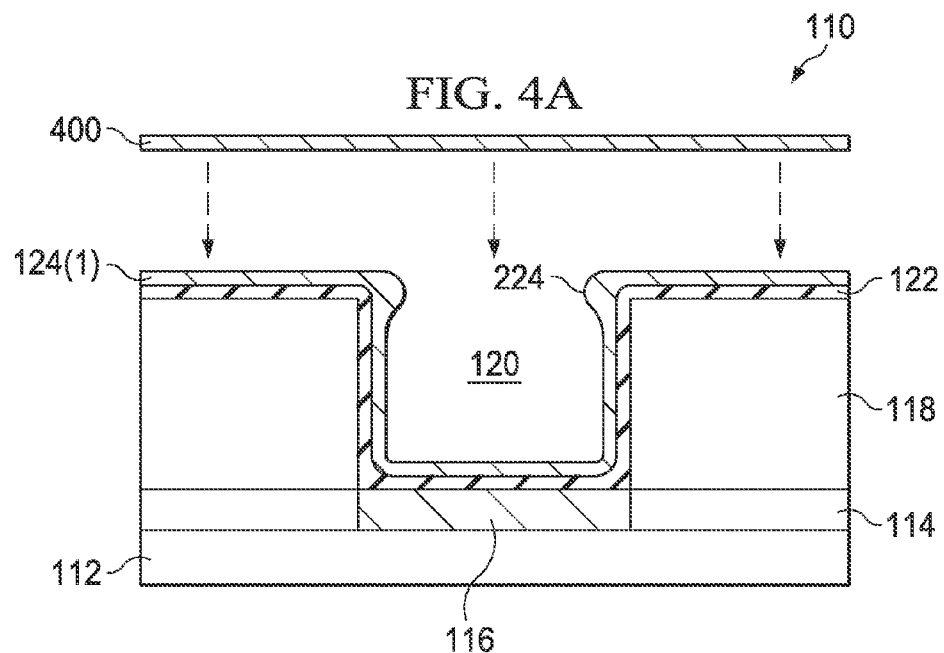
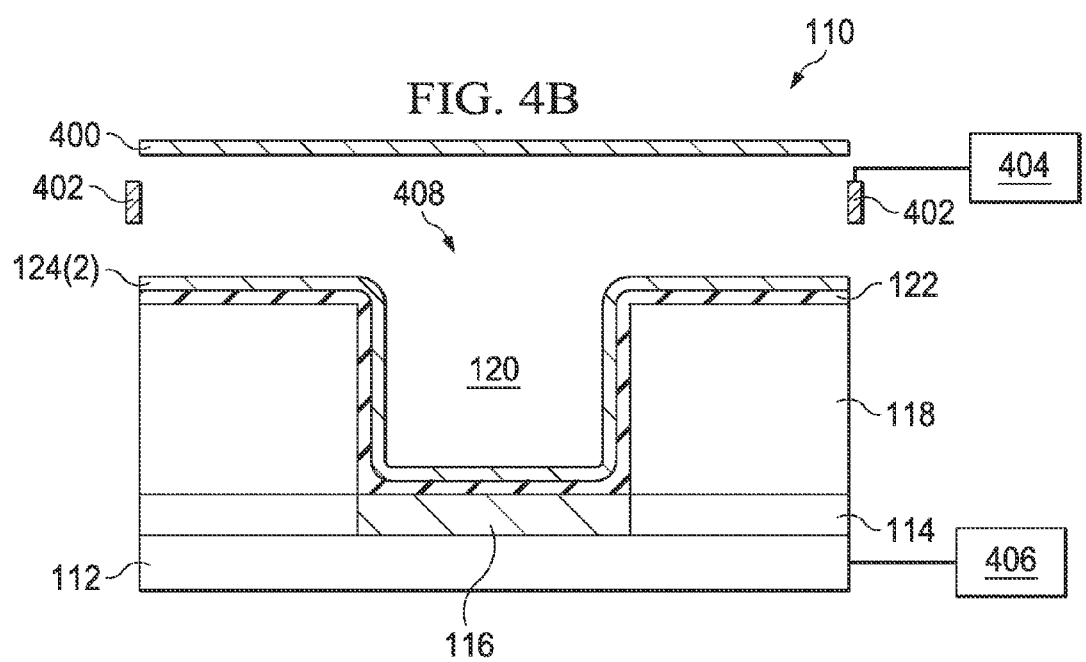

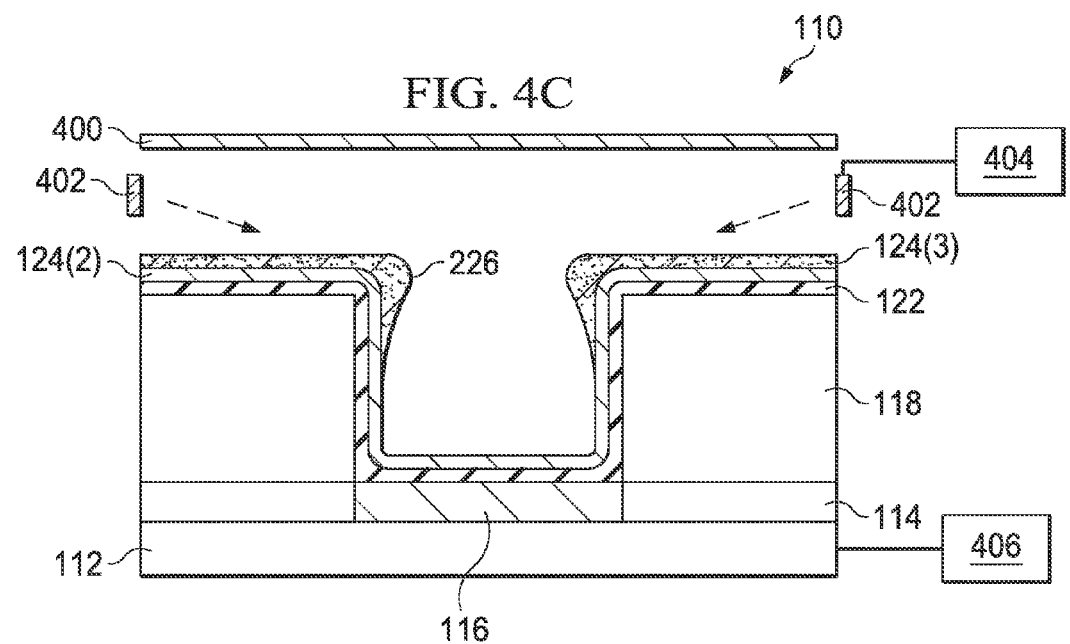
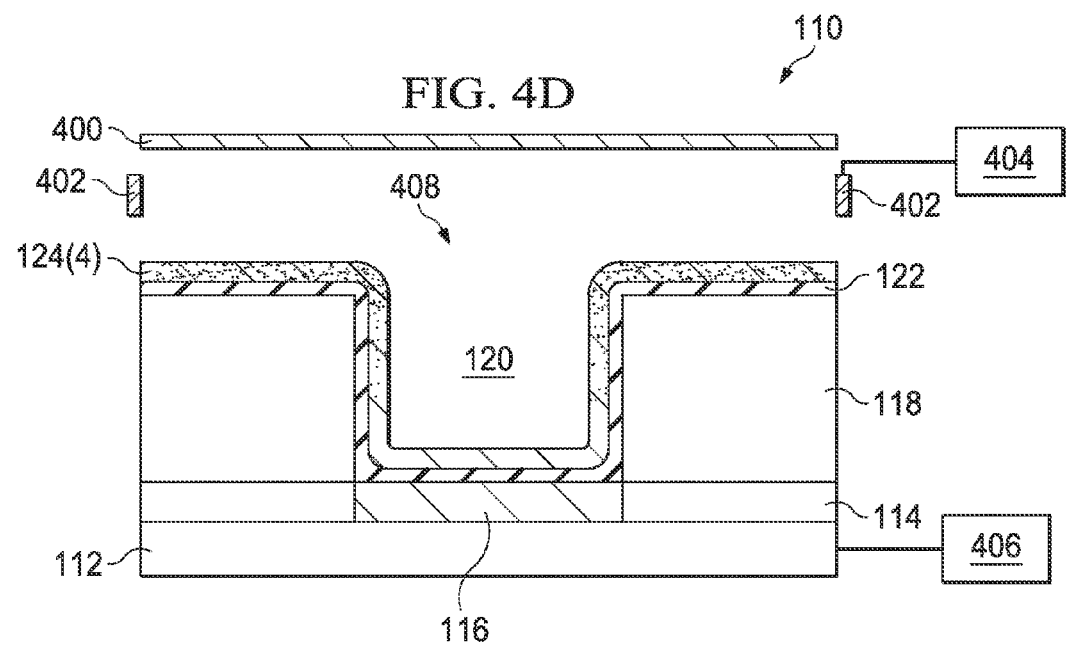

COPPER SEED LAYER FOR AN INTERCONNECT STRUCTURE HAVING A DOPING CONCENTRATION LEVEL GRADIENT

TECHNICAL FIELD

The present invention relates to a method for manufacturing integrated circuits and, in particular, to a method for manufacturing a metal seed layer of an interconnect structure for an integrated circuit.

BACKGROUND

The damascene and dual damascene processes for forming interconnect structures such as metal lines, vias and other interconnects in integrated circuits are well known to those skilled in the art. These processes typically require the formation of a metal seed layer over a wafer surface (including on the side walls and floor of any trench structures produced at locations where metal interconnect structures are desired). The seed layer is required in order to provide a low-resistance electrical path which supports a subsequent uniform metal electroplating over the wafer surface to be accomplished. The metal electroplating process fills the lined trench structures and defines the resulting interconnect structures of a metallization layer for the integrated circuit.

Reference is now made to FIGS. 1A-1F (not drawn to scale) which illustrate process steps for forming a metal interconnect structure of an integrated circuit in accordance with the prior art. The known damascene process may generally be described as follows: As shown in FIG. 1A, a wafer 10 is formed which comprises a semiconductor substrate 12 including integrated circuit devices formed in and/or on the substrate (not shown), a pre-metal dielectric (PMD) layer 14 overlying the substrate, and a plurality of electrical contact members 16, such as tungsten plugs or the like, extending through the PMD layer to reach the integrated circuit devices. The pre-metal dielectric (PMD) layer 14 is planarized using, for example, chemical mechanical polishing (CMP) to provide a flat surface for supporting metallization layers of the integrated circuit device. Next, a low-k intermetal dielectric layer 18 is provided over the PMD layer 14 (FIG. 1B), the dielectric layer 18 for example being formed of a multilayer structure including a low-k layer and one or mask layers (for example including a TEOS mask and titanium nitride mask). This low-k intermetal dielectric layer 18 is also planarized. A trench 20 is then formed extending into and perhaps through the low-k intermetal dielectric layer 18 (FIG. 1C). The trench 20 is provided at a location where an interconnect structure is to be located, and in a preferred implementation will have a depth sufficient to expose the top surface of the underlying electrical contact member 16. A blanket formation of a diffusion barrier layer 22 is then made (FIG. 1D) on the wafer (including over the top of the low-k intermetal dielectric layer 18 and on the side walls and floor within the trench 20). This diffusion barrier layer 22 serves to block the migration of subsequently deposited metal atoms for the interconnect structure into the low-k intermetal dielectric layer, as well as block the diffusion in the opposite direction of contaminants from the low-k intermetal dielectric layer to the interconnect structure. Next, a metal seed layer 24 is formed on the wafer (FIG. 1E) using any suitable deposition process such as sputtering over the diffusion barrier layer 22. This seed layer 24 covers the diffusion barrier layer 22 on the top surface of the low-k intermetal dielectric layer 18 as well as the side walls and floor of the trench 20. Optionally, a metal liner layer (not shown) may be deposited between the diffusion barrier layer 22 and the metal seed layer 24. Further optionally, a seed layer etchback (not shown) may be performed to reduce metal overhang at the top corners of the trench 20. An electroplating process is then performed on the wafer to cause the remaining open portion of the trench 20 to be filled with metal 26 (FIG. 1F). Electroplated metal is also produced above the top of the wafer. Chemical mechanical polishing (CMP) is then performed to remove the excess and unwanted portions of the diffusion barrier layer 22, the metal seed layer 24 and the electroplated metal 26 which are located outside of the trench (FIG. 1G). The polishing operation further provides a flat top surface for the wafer that is ready for further integrated circuit processing. As part of that further processing, a dielectric cap layer 28 may be deposited on the flat top surface to protect the low-k intermetal dielectric layer and the metal layers and materials of the formed metal lines and interconnects (FIG. 1H).

The processes of FIGS. 1B-1H may then be repeated, as needed, to form additional metallization layers for the integrated circuit device. In this context, it will be understood that the underlying electrical contact member 16 could thus comprise the metal filled trench of an underlying metallization layer and the dielectric cap layer 28 could thus comprise one of the layers within the low-k intermetal dielectric layer 18.

The metal selected for the metal seed layer 24 and the electroplated metal 26 is typically copper. The diffusion barrier layer 22 is typically tantalum nitride. It will, of course, be understood that other materials could instead be chosen.

It is known in the art to add a dopant material to the copper sputtering target used in the deposition of the metal seed layer 24 (i.e., the sputtering target is formed of copper alloyed with another material). For example, the dopant may comprise manganese (Mn) or aluminum (Al). The added dopant material will typically be substantially uniformly distributed throughout the deposited copper seed layer 24. In other words, and with reference to concentration line 302 in FIG. 3, there will exist a relatively uniform doping concentration as a function of trench depth for the metal seed layer 24.

During the high temperature process used to form the dielectric cap layer 28, as well as during further other thermal cycles and processing operations associated with completing fabrication of the integrated circuit (such as with the addition of further metallization layers), those skilled in the art understand that the added dopant species may migrate from the copper seed layer 24 and diffuse through the electroplated copper metal 26 fill to form a self-aligned metal cap located at the interface 30 between the dielectric cap layer 28 and the electroplated copper metal 26 which fills the trench 20. It is desirable for a high percentage of the added dopant species to migrate from the seed layer 24 to the interface 30 between the dielectric cap layer 28 and the electroplated metal 26 which fills the trench 20 because this interface tends to be the initiation area of copper electromigration which can lead to circuit failure. However, a not insignificant fraction of the added dopant species, especially the dopant species located in the copper seed layer 24 near the bottom of the trench 20, have difficulty in successfully migrating to the interface 30 area for the self-aligned metal cap. The reasons for this failure include: the traveling distance is too long, the migration time is too short, and dopant species trapping locations may exist within the electroplated metal 26 fill near the bottom of the trench 20. The trapped or unsuccessfully migrated doping species can significantly affect subsequent copper grain growth and produce an unacceptable increase in copper line resistance.

Thus, it is desirable to segregate the doping species toward the interface 30. The failure to segregate can result in shorter electromigration life time and increased metal line resistance. The retention of doping species in the seed layer or fill away from the interface affects copper grain growth resulting in copper microstructures with high electrical resistance.

As semiconductor processing techniques move to finer geometries, the interface 30 between the electroplated copper metal 26 fill and the dielectric cap layer 28 presents a significant challenge to ensuring satisfactory reliability performance. There would be an advantage to having a seed layer formation process which supports better segregation of the dopant species from the seed layer 24 to the interface 30 in order to form a self-aligned metal cap where there would otherwise not exist a sufficient barrier or adhesion layer.

SUMMARY

In an embodiment, a process comprises: opening a trench in a dielectric layer; lining the trench with a barrier layer; lining the trench with a metal seed layer, wherein the metal seed layer is non-uniformly doped and exhibits a vertical doping gradient varying as a function of trench depth; and filling the trench with a metal fill.

In an embodiment, an apparatus comprises: a trench formed in a dielectric layer; a barrier layer lining the trench; a metal seed layer lining the trench, wherein the metal seed layer has a non-uniform dopant concentration and exhibits a vertical doping gradient varying as a function of trench depth; and a metal fill that fills the trench.

In an embodiment, a sputter chamber comprises: an enclosure; an inlet to the enclosure configured to receive processing gas; a sputter target formed of a metal material and having a doping concentration less than about 0.5%; an RF coil formed of said metal material and having a doping concentration in excess of about 0.5%; and a pedestal configured to support an integrated circuit wafer within the enclosure.

BRIEF DESCRIPTION OF THE DRAWINGS

For a better understanding of the embodiments, reference will now be made by way of example only to the accompanying figures in which:

FIGS. 4A to 4E illustrate process steps for forming a non-uniformly doped metal seed layer.

DETAILED DESCRIPTION OF THE DRAWINGS

Figure 2A:
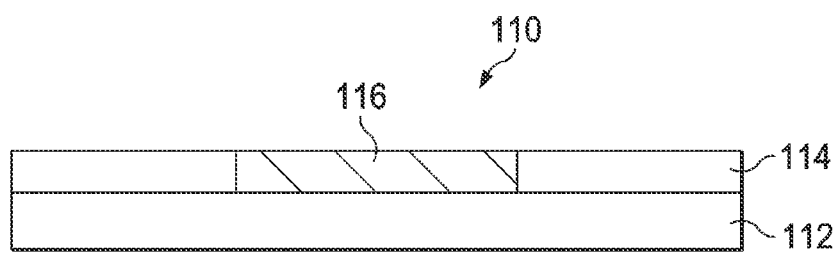
FIGS. 2A to 2I illustrate process steps for forming a metal interconnect structure of an integrated circuit.
Figure 2B:
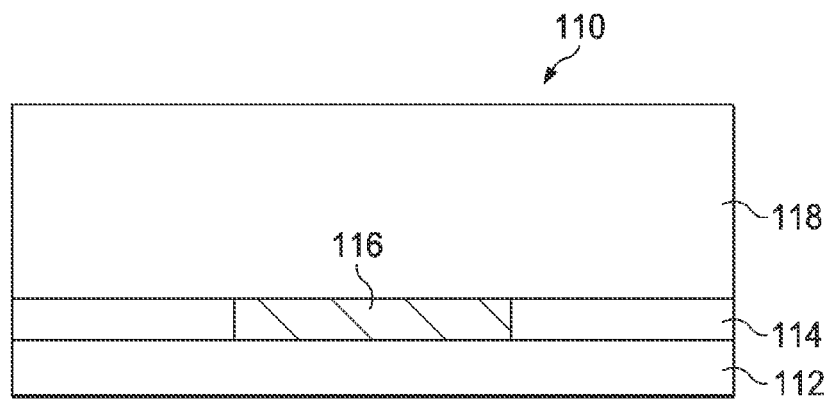
Figure 2C:
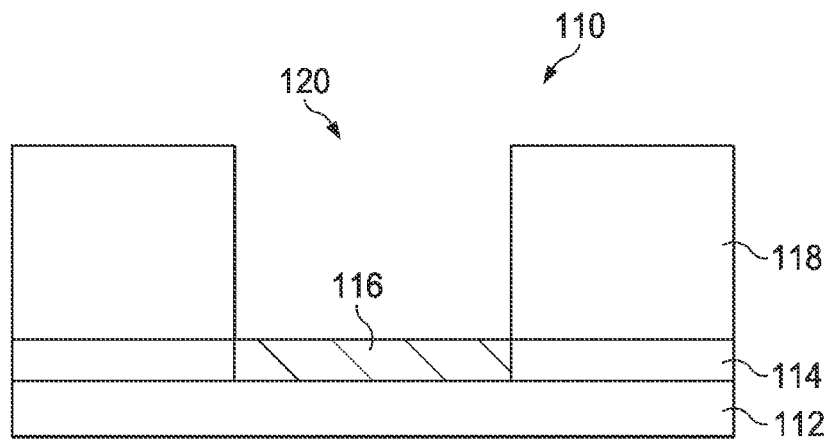
Figure 2D:
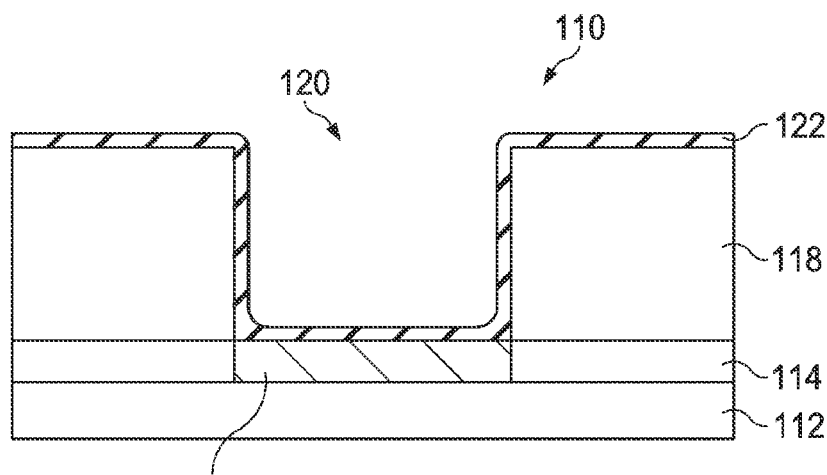

Reference is now made to FIGS. 2A-2I (not drawn to scale) which illustrate process steps for forming a metal interconnect structure of an integrated circuit. As shown in FIG. 2A, a wafer 110 is formed which comprises a semiconductor substrate 112 including integrated circuit devices formed in and/or on the substrate (not shown), a pre-metal dielectric (PMD) layer 114 overlying the substrate, and a plurality of electrical contact members 116, such as tungsten plugs or the like, extending through the PMD layer to reach the integrated circuit devices. The pre-metal dielectric (PMD) layer 114 is planarized using, for example, chemical mechanical polishing (CMP) to provide a flat surface for supporting metallization layers of the integrated circuit device. Next, a low-k intermetal dielectric layer 118 is provided over the PMD layer 114 (FIG. 2B), the dielectric layer 118 for example being formed of a multilayer structure including a low-k layer and one or mask layers (for example including a TEOS mask and titanium nitride mask). This low-k intermetal dielectric layer 118 is also planarized. A trench 120 is then formed extending into and perhaps through the low-k intermetal dielectric layer 118 (FIG. 2C). The trench 120 is provided at a location where an interconnect structure is to be located, for example exposing a top surface of the underlying electrical contact member 116. A blanket formation of a diffusion barrier layer 122 is then made (FIG. 2D). This diffusion barrier layer 122 serves to block the migration of subsequently deposited metal atoms for the interconnect structure into the low-k intermetal dielectric layer, as well as block the diffusion in the opposite direction of contaminants from the low-k intermetal dielectric layer to the interconnect structure.

Figure 1A:
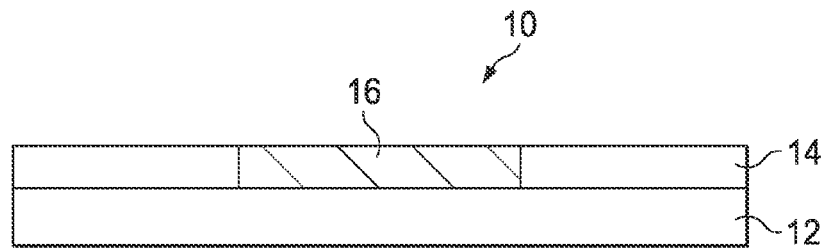
FIGS. 1A to 1H illustrate process steps for forming a metal interconnect structure of an integrated circuit in accordance with the prior art.
Figure 1B:
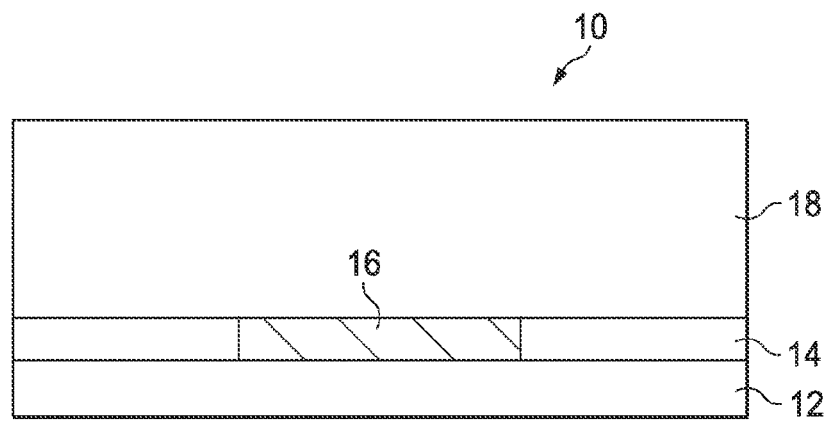
Figure 1C:
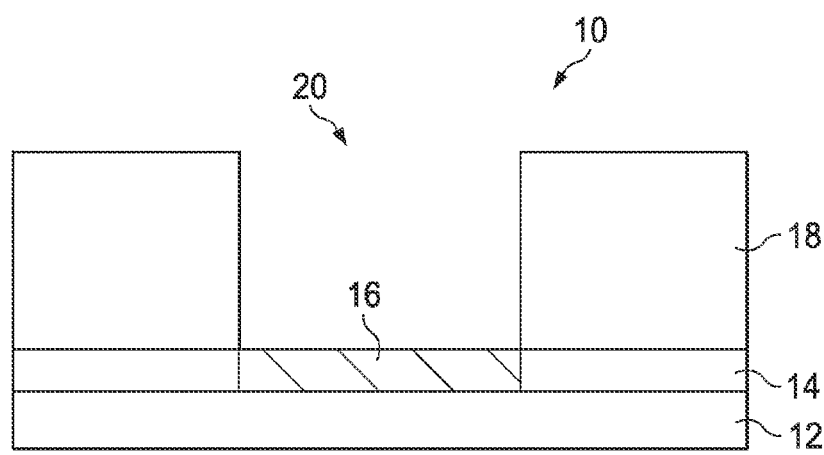
Figure 1D:
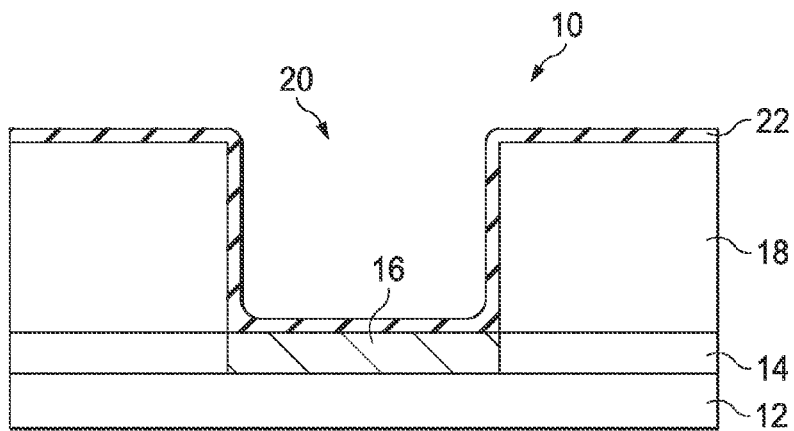
Figure 1E:
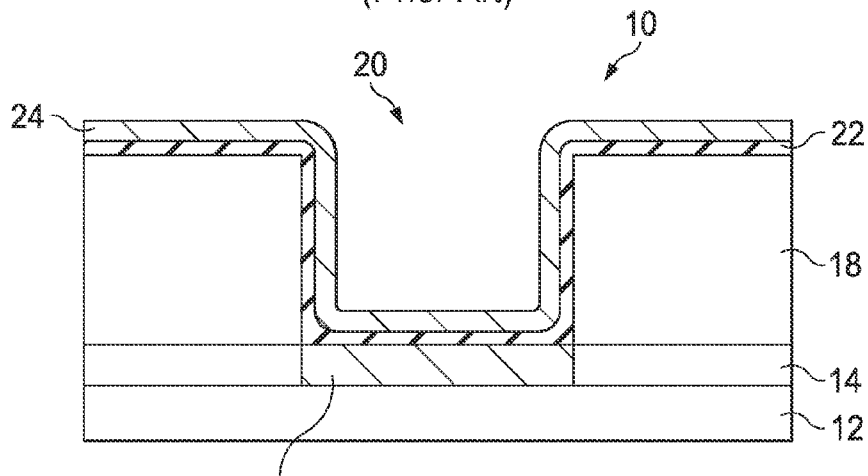
Figure 1F:
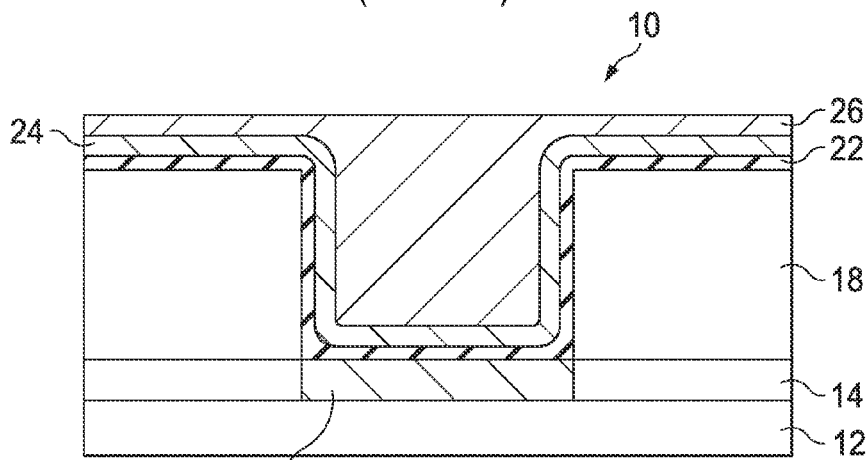
Figure 1G:
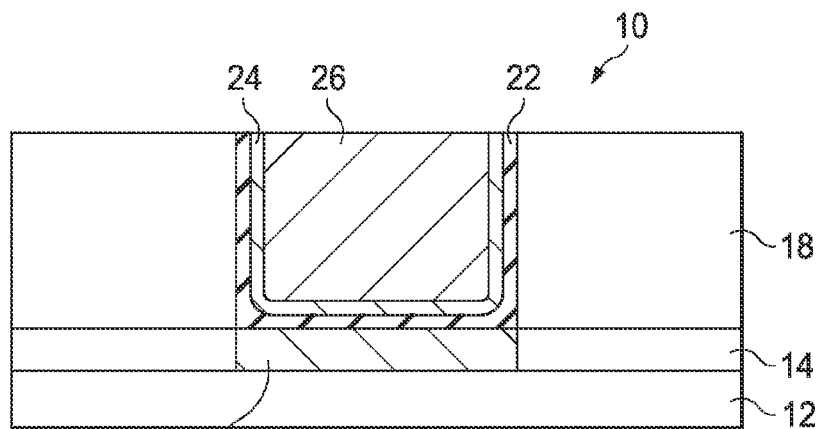
Figure 2E:
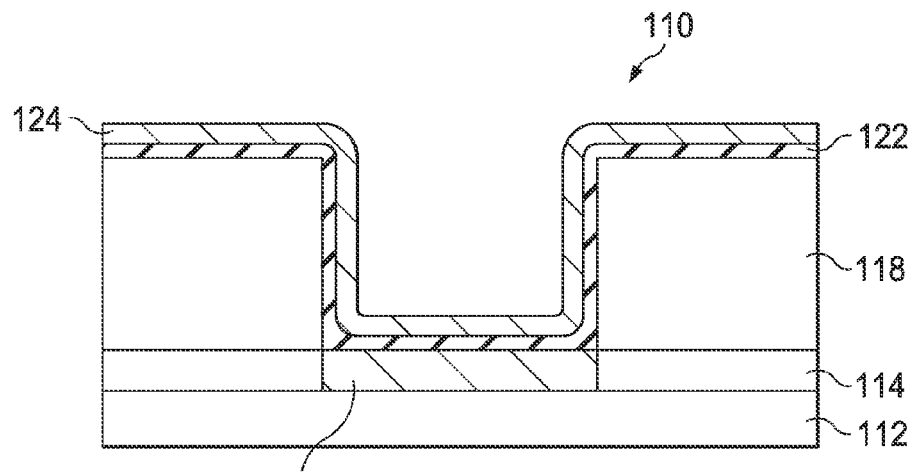

Next, a metal seed layer 124 is formed on the wafer (FIG. 2E) using a unique deposition process for sputtering metal over the diffusion barrier layer 122. This seed layer covers the diffusion barrier layer 122 on the top surface of the low-k intermetal dielectric layer 118 as well as the side walls and floor of the trench 120. While the metal seed layer 24 of the prior art process (deposited as shown in FIG. 1E using conventional techniques) was either un-doped or substantially uniformly doped (for example, with manganese (Mn) or aluminum (Al)), the metal seed layer 124 in FIG. 2E is non-uniformly doped and indeed uniquely exhibits a vertical doping gradient (i.e., the concentration of dopant species in the metal seed layer 124 varies by decreasing as a function of depth). The stippling of the metal seed layer 124 in FIG. 2E illustrates the vertical doping gradient where a higher concentration of dopant species is present on the top surface of the low-k intermetal dielectric layer 118 and at and near the top of the trench 120, while there is little to no dopant present in the metal seed layer 124 at or near the bottom of the trench 120.

Figure 3:
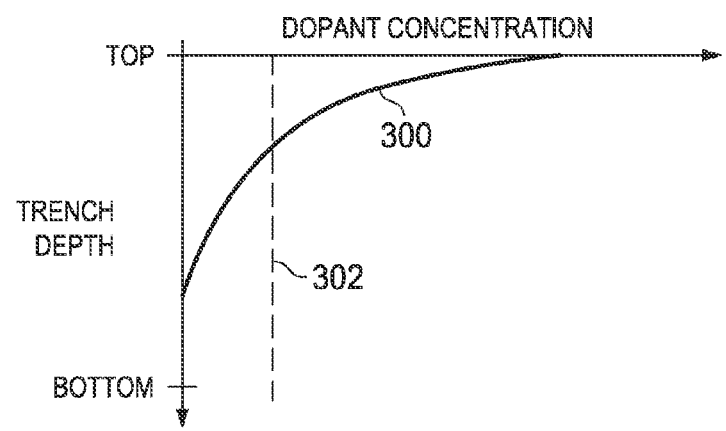
FIG. 3 is a graph illustrating doping concentration of the metal seed layer as a function of trench depth.

Reference is now made to FIG. 3 which shows a graph illustrating the doping concentration 300 of the metal seed layer 124 as a function of trench depth. For comparison purposes, the relatively uniform doping concentration 302 as a function of trench depth for the metal seed layer 24 of the prior art process (FIG. 1E) is also illustrated. As an exemplary implementation, the relatively uniform doping concentration 302 may be at or about 0.5% and the gradient for the non-uniform doping concentration 300 may extend from about 0% at the bottom of the trench to about 5%-10% at the top of the trench. Trench depth may, for example, be about 100-200 nm and more particularly about 150 nm.

Optionally, a metal liner layer (not shown) may be deposited between the diffusion barrier layer 122 and the metal seed layer 124.

Figure 4E:
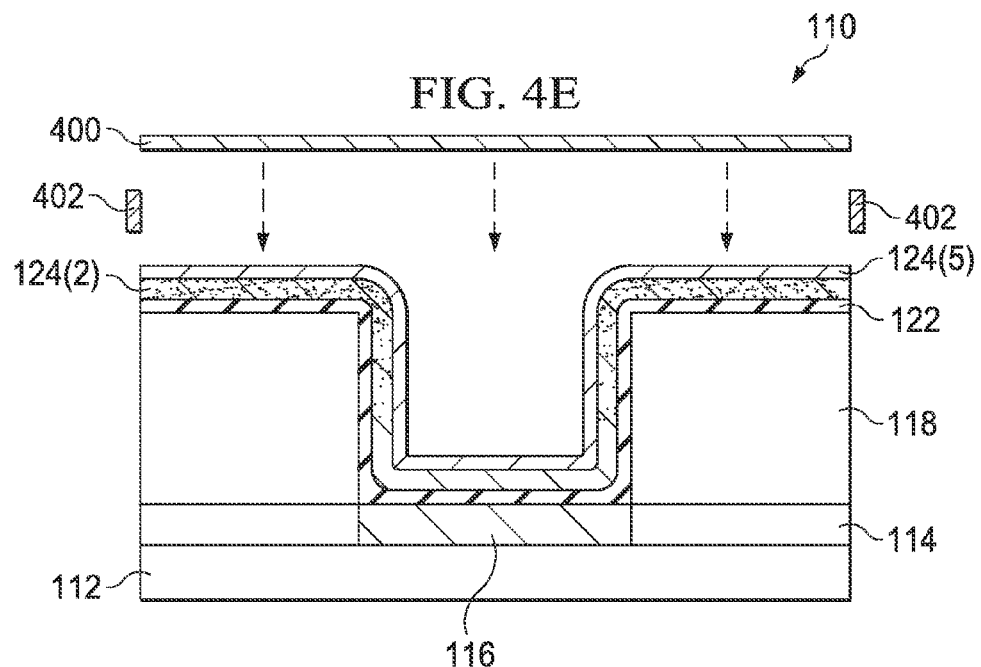

The formation of the non-uniformly doped metal seed layer 124 may be accomplished using the process illustrated in FIGS. 4A-4E (not drawn to scale). In FIG. 4A, a metal layer 124(1) is deposited over the diffusion barrier layer 122. The metal layer 124(1) is preferably a pure copper layer. Alternatively, the metal layer 124(1) may be very lightly and uniformly doped (for example, with a dopant concentration of 0.5% or less). This metal layer 124(1) comprises an initial copper seed layer that is preferably deposited from a copper sputter target 400 in a substantially vertical direction (as shown by the dotted arrows) in a manner known to those skilled in the art. The sputter target 400 is preferably pure copper, but may be very lightly doped (for example, with a dopant concentration of 0.5% or less).

The metal layer 124(1) typically will not exhibit a uniform thickness in its deposition and will include overhang areas 224 near the top of the trench 120. In FIG. 4B, an etchback is performed to remove the overhang areas 224 leaving a metal layer 124(2) having a more uniform thickness. It will be understood that the performance of the overhang etchback step is optional, and not needed in instances where thickness of the metal layer 124(1) deposition is more uniformly controllable or where the aspect ratio of the trench 120 is relatively low or where the width of the trench 120 is relatively large). The etchback process is accomplished, for example, by the use of positively charged copper ions (generated by self-ionized plasma near the copper sputter target 400) and/or argon ions (generated by RF power (from supply 404) that is supplied to an RF coil 402 located between the copper sputter target 400 and the wafer 110 substrate 112) that are accelerated by a negative wafer bias voltage (applied by supply 406). The energetic ions function to remove the copper overhang areas 224 at the top of the trench 120, thereby providing a larger gap opening 408 in support of subsequent process steps.

In FIG. 4C, a metal layer 124(3) is deposited over the metal layer 124(2). The metal layer 124(3) is a doped copper layer (for example, having a dopant concentration far in excess of 0.5%, and for example having a dopant concentration in the range of 0.5% to 10%, and more specifically in the range of 5% to 10%). The metal layer 124(3) is deposited as a sputter primarily (and perhaps exclusively) from the RF coil 402. To support sputter deposition of the doped copper layer 124(3), the RF coil 402 is provided as a copper coil that has been doped with a dopant concentration far in excess of 0.5%. The RF coil 402 can be used instead of the sputter target 400 as the sputter source, for example, through an appropriate configuration of power supplied by the power supply 404. Because the sputter target for doped copper deposition is the RF coil 402 instead of the sputter target 400, the sputtered deposition has an angular orientation (i.e., it is non-vertically directional as illustrated by the dotted arrows) and occurs primarily on the top of the wafer 110, at the top corners of the trench 120 and at the top of the trench side walls. Very little, if any, deposition is made on the floor of the trench or bottom of the trench side walls. The non-vertically directional deposition may, for example, have an angle of 20 to 60 degrees measured from the surface of the wafer and is determined by the placement of the RF coil 402 relative to the wafer.

As the metal layer 124(3) and metal layer 124(2) are both copper layers, the layered distinction illustrated in FIG. 4C is not representative of the actual structure and is instead more illustrative of the processing operation. In actuality, the metal layers 124(2) and 124(3) will merge. The merged metal layers 124(2) and 124(3) will not exhibit a uniform thickness and will include overhang areas 226 near the top of the trench 120. Furthermore, the merged metal layers 124(2) and 124(3) will exhibit a non-uniform doping concentration where the concentration of dopant present in the merged metal layers decreases as a function of trench depth.

In FIG. 4D an etchback is performed to remove the overhang areas 226 leaving a non-uniformly doped metal layer 124(4) having a more uniform thickness. It will be understood that the performance of the overhang etchback step is optional. The etchback process is accomplished, for example, by the use of positively charged copper ions (generated by self-ionized plasma near the copper sputter target) and/or argon ions (generated by RF power (from supply 404) that is supplied to the RF coil 402 located between the copper sputter target 400 and the wafer 110 substrate 112) that are accelerated by a negative wafer bias voltage (from supply 406). The energetic ions function to remove the copper overhang areas 226 at the top of the trench 120, thereby providing a larger gap opening 408 for subsequent process steps. Additionally, or alternatively, thermal or ion-assisted reflow can be performed to open the top of the trench 120.

The process steps illustrated in FIGS. 4C and 4D can be repeated as often as necessary to produce a non-uniformly doped metal seed layer 124 with a desired doping level, coverage profile and/or thickness. Such a non-uniformly doped metal seed layer 124 is shown in FIG. 2E.

In FIG. 4E, a metal layer 124(5) is optionally deposited over the non-uniformly doped metal layer 124(4). The metal layer 124(5) is preferably a pure copper layer. Alternatively, the metal layer 124(5) may be very lightly doped (for example, with a dopant concentration of 0.5% or less). This metal layer 124(5) comprises a final copper flash layer that is preferably deposited from the copper sputter target 400 in a substantially vertical direction (as shown by the dotted arrows) in a manner known to those skilled in the art. The sputter target 400 is preferably pure copper, but may be very lightly doped (for example, with a dopant concentration of 0.5% or less). This optional final copper flash layer serves to cover up areas in the trench 120 that may have marginal copper seed due to performance of the previously executed etchback and reflow operations. This completes the formation of the metal seed layer 124 shown in FIG. 2E.

Figure 2F:
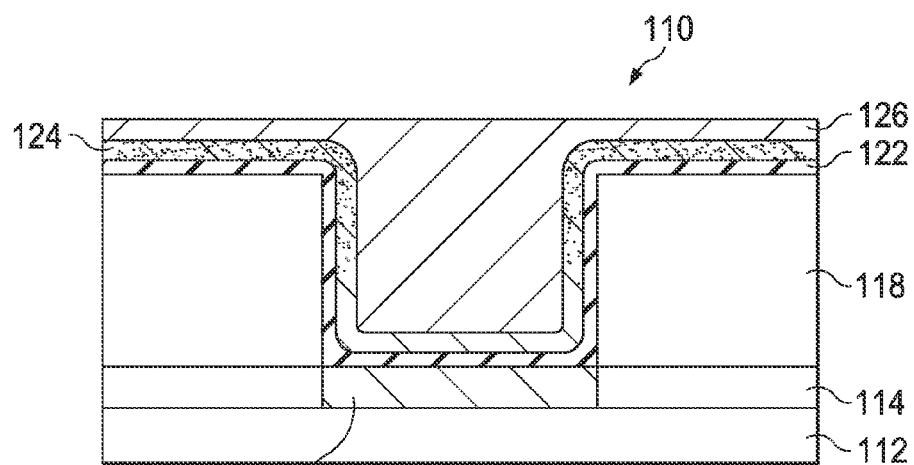
Figure 2G:
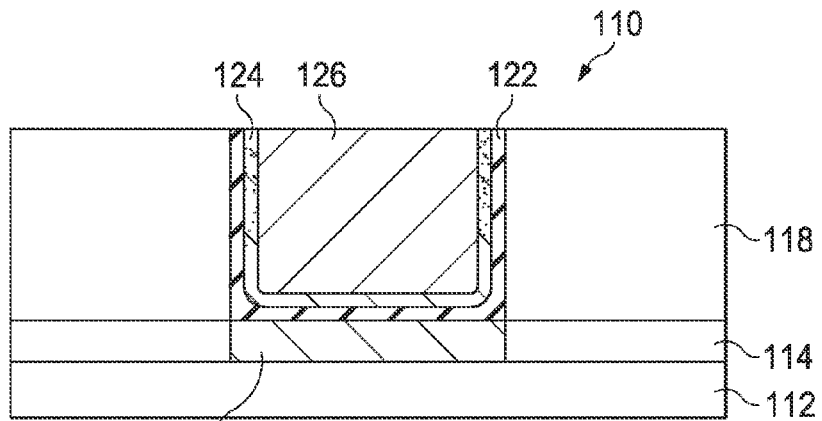
Figure 2H:
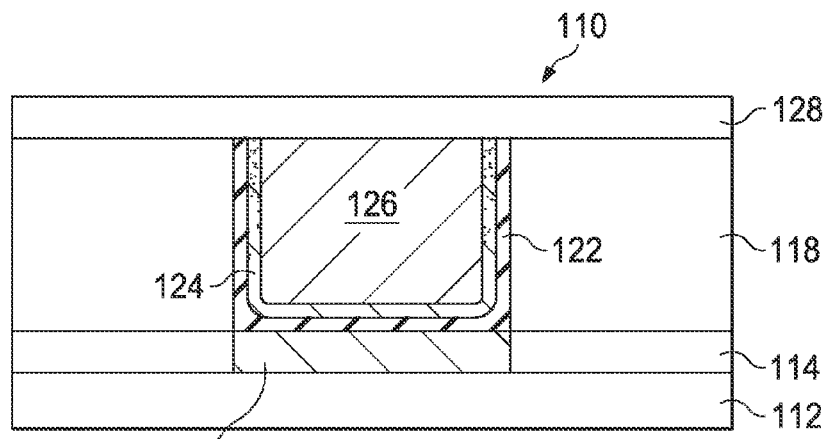

Reference is once again made to FIGS. 2A-2I. An electroplating process is then performed on the wafer to fill the remaining open portion of the trench 120 with metal 126 (FIG. 2F). Electroplated metal is also produced above the top of the wafer. Chemical mechanical polishing (CMP) is then performed to remove the excess and unwanted portions of the diffusion barrier layer 122, the metal seed layer 124 and the electroplated metal 126 that are located outside of the trench (FIG. 2G). The polishing operation further provides a flat top surface for the wafer that is ready for further integrated circuit processing. As part of that further processing, a dielectric cap layer 128 may be deposited on the flat top surface to protect the low-k intermetal dielectric layer and the metal layers and materials of the formed metal lines and interconnects (FIG. 2H).

The processes of FIGS. 2B-2H may then be repeated, as needed, to form additional metallization layers for the integrated circuit device. In this context, it will be understood that the underlying electrical contact member 116 could thus comprise the filled trench of an underlying metallization layer and the dielectric cap layer 128 could thus comprise one of the layers within the low-k intermetal dielectric layer 118.

Figure 1H:
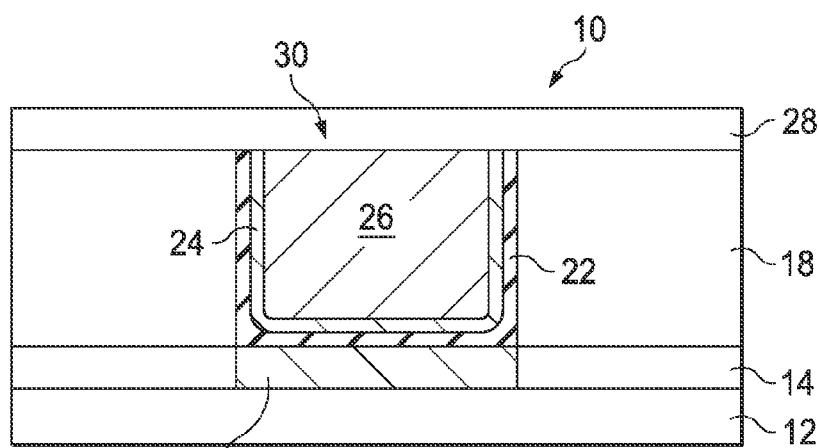
Figure 2I:
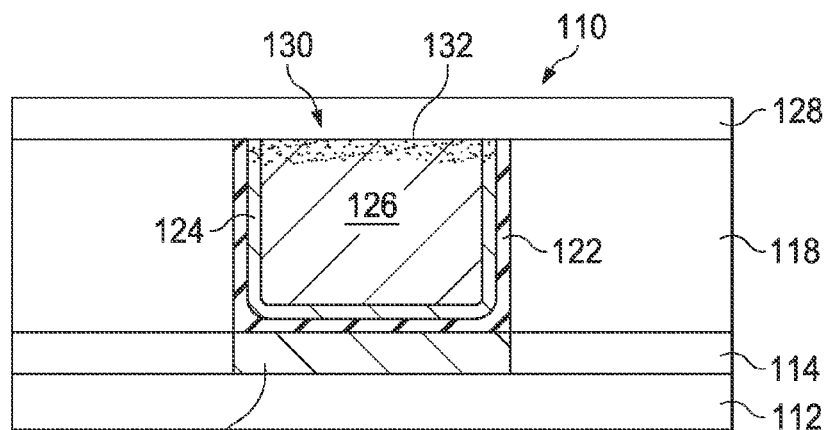

The performance of the high temperature process used to form the dielectric cap layer 128, as well as the performance of other thermal cycles and processing operations associated with completing fabrication of the integrated circuit (such as with the addition of further metallization layers), causes a migration of the dopant species from the non-uniformly doped seed layer 124 towards the interface 130 between the dielectric cap layer 128 and the electroplated metal 126 which fills the trench 120. This migration forms a self-aligned metal cap 132 (FIG. 2I). Because the non-uniformly doped seed layer 124 has a doping gradient presenting a higher dopant concentration close to the top of the trench 120, the dopant species are presented with a shorter migration distance to reach the interface 130 location for the self-aligned metal cap 132. Furthermore, there is less likelihood of the doping species being trapped before completing migrating to the interface 130. As a result, an integrated circuit including the structure shown in FIG. 2I possesses decreased copper liner resistance, better formation of a barrier or adhesion layer at the interface, and better reliability (lower circuit failure rate) relative to the embodiment shown in FIG. 1H.

The metal selected for the metal seed layer 124 and the electroplated metal 126 is typically copper. The diffusion barrier layer 122 is typically tantalum nitride. The dopant species may comprise manganese (Mn) or aluminum (Al).

Although illustrated in connection with a damascene process, it will be understood that the method described herein for forming a non-uniformly doped seed layer 124 is equally applicable to the dual damascene process as well as to other processes known in the art which are used to fill trench-like structures in integrated circuit devices with a metal material.

Figure 5:
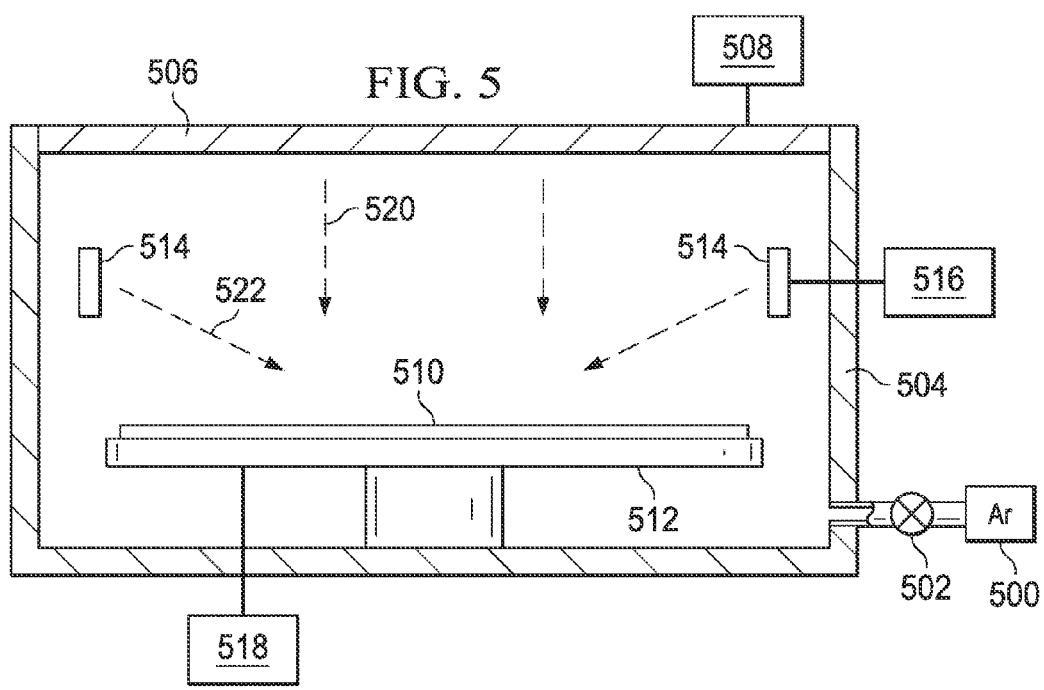
FIG. 5 is a diagram of a sputter chamber suited for implementing the processes described above for forming a non-uniformly doped metal seed layer.

Reference is now made to FIG. 5 (not drawn to scale) wherein there is shown a diagram of a sputter chamber suited for implementing the process described above for forming a non-uniformly doped metal seed layer. An argon gas source 500 supplies argon through a flow controller 502 to the inside of chamber 504. The argon gas is used as a sputter working gas during sputtering operations, or as a sputtering etching gas during etching operations. The chamber 504 further includes a copper sputtering target 506. The target 506 is preferably pure copper, but may include a very light dopant (for example, less than 0.5%). A first power supply 508, for example a DC power supply, applies a negative voltage to the target 506 to excite the argon into a plasma. The copper target 506 may be configured for self-sustained sputtering. Positively charged argon ions are attracted to the negatively biased target 506, and a vertically directional copper sputter 520 is produced. The sputtered copper deposits on a wafer 510. The wafer 510 is supported by a pedestal or chuck 512. An RF coil 514 is wrapped around the region directly above the wafer 510 between the target 506 and the chuck 512. A second power supply 514 is coupled to the RF coil 514. In conventional operation the second power supply 514 supplies a high frequency RF signal (for example, of about 2 MHz) to the RF coil 514 to generate an argon plasma during etching. As discussed above, the RF coil 514 is formed of doped copper and is used in connection with an additional sputtering operation to deposit a vertically graded doped copper layer on certain portions of the wafer 510. The dopant well exceeds 0.5%. For this purpose, the second power supply 514 alternatively applies a negative voltage and RF power to the RF coil 514 to excite the argon into a plasma and cause non-vertically directional sputtering 522 of doped copper on the wafer 510. A bias RF supply 518 electrically biases the chuck 512. When a plasma is developed above the wafer 510, using any of the techniques described above, the RF bias on the chuck 512 attracts and accelerates ions from the plasma towards the wafer 510. During sputtered deposition, the attracted ions are copper ions or doped copper ions sputtered from the target 506 or RF coil 514, respectively. Alternatively, the attracted ions are argon ions used in etching the wafer 510.

It will accordingly be noted that the sputter chamber can be used for both the conventional copper sputter from target 506 and the directional doped copper sputter from RF coil 514 and further the etchback operation. Thus, the process steps described herein can be performed in a single process chamber without need to break seal.

Advantages of the formation of a non-uniformly doped metal seed layer 124 include: a) minimal copper grain growth penalty from doping species present in the seed layer; b) easier segregation (i.e., migration) of the doping species from the seed layer to a destination region such as the interface; c) flexibility to change doping level for the copper seed layer using the same processing equipment (chamber); and d) ability to present seed layers with different doping characteristics on different metallization layers, for example, using a pure copper seed layer on some metallization layers and a doped copper seed layer on other layers, or using a first doping concentration on one metallization layer and a different doping concentration on another layer.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A process, comprising:
   opening a trench in a dielectric layer;
   lining the trench with a barrier layer;
   lining the trench with a metal seed layer, wherein the metal seed layer is non-uniformly doped and exhibits a vertical doping gradient varying as a function of trench depth; and
   filling the trench with a metal fill.

2. The process of claim 1, wherein opening the trench comprises opening the trench at a location for an interconnect structure of an integrated circuit.

3. The process of claim 1, wherein the barrier layer is formed of tantalum nitride.

4. The process of claim 1, wherein the metal seed layer comprises copper.

5. The process of claim 4, wherein a dopant material of the metal seed layer is selected from the group consisting of manganese and aluminum.

6. The process of claim 1, wherein lining the trench with the metal seed layer comprises:
   a) depositing an initial metal seed layer having a doping concentration less than 0.5% with a substantially vertical deposition direction;
   b) depositing a doped metal seed layer having a doping concentration in excess of 0.5% with a non-vertical angled deposition direction that cause deposition of the doped metal seed layer at least primarily at upper portions of the trench.

7. The process of claim 6, further comprising repeating a) depositing and b) depositing.

8. The process of claim 6, further comprising c) depositing a final metal seed layer having a doping concentration less than 0.5% with a substantially vertical deposition direction.

9. The process of claim 6, wherein the doping concentration in excess of 0.5% is in the range of >0.5% to 10%.

10. The process of claim 1, further comprising depositing a dielectric cap layer over the metal filled trench.

11. The process of claim 10, further comprising migrating dopant from the non-uniformly doped metal seed layer to an interface between the metal filled trench and the dielectric cap layer to form a self-aligned metal cap.

12. An apparatus, comprising:
    a trench formed in a dielectric layer;
    a barrier layer lining the trench;
    a metal seed layer lining the trench, wherein the metal seed layer has a non-uniform dopant concentration and exhibits a vertical doping gradient varying as a function of trench depth; and
    a metal fill that fills the trench.

13. The apparatus of claim 12, wherein the metal filling the trench defines an interconnect structure of an integrated circuit.

14. The apparatus of claim 12, wherein the barrier layer is formed of tantalum nitride.

15. The apparatus of claim 12, wherein the metal seed layer comprises copper.

16. The apparatus of claim 15, wherein a dopant material of the metal seed layer is selected from the group consisting of manganese and aluminum.

17. The apparatus of claim 12, wherein the metal seed layer comprises:
   an initial metal seed layer having a doping concentration less than 0.5%; and
   a doped metal seed layer having a doping concentration in excess of 0.5% present at least primarily at upper portions of the trench.

18. The apparatus of claim 17, further comprising a final metal seed layer having a doping concentration less than 0.5%.

19. The apparatus of claim 17, wherein the doping concentration in excess of 0.5% is in the range of >0.5% to 10%.

20. The apparatus of claim 12, further comprising a dielectric cap layer formed over the metal filled trench.

21. The apparatus of claim 20, further comprising a self-aligned metal cap formed at an interface between the metal filled trench and the dielectric cap layer from dopant migrated from the non-uniformly doped metal seed layer.

22. A sputter chamber, comprising:
   an enclosure;
   an inlet to the enclosure configured to receive processing gas;
   a sputter target formed of a metal material and having a doping concentration less than about 0.5%;
   an RF coil formed of said metal material and having a doping concentration in excess of about 0.5%; and
   a pedestal configured to support an integrated circuit wafer within the enclosure.

23. The chamber of claim 22, wherein the doping concentration of the RF coil in excess of about 0.5% is in the range of >0.5% to 10%.

24. The chamber of claim 22, wherein the metal material comprises copper.

25. The chamber of claim 24, wherein a dopant material is selected from the group consisting of manganese and aluminum.

26. The chamber of claim 22, wherein the RF coil is configurable to operate as an additional sputter target for sputter deposition of the doped metal material on a surface of the integrated circuit wafer.

* * * * *